(12) United States Patent
Kamijima

(10) Patent No.: US 12,237,704 B2
(45) Date of Patent: Feb. 25, 2025

(54) BATTERY MANAGEMENT SYSTEM AND BATTERY MANAGEMENT METHOD

(71) Applicant: Panasonic Intellectual Property Management Co., Ltd., Osaka (JP)

(72) Inventor: Junya Kamijima, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 865 days.

(21) Appl. No.: 17/112,986

(22) Filed: Dec. 5, 2020

(65) Prior Publication Data

US 2021/0091583 A1 Mar. 25, 2021

Related U.S. Application Data

(63) Continuation of application No. PCT/JP2019/022945, filed on Jun. 10, 2019.

(30) Foreign Application Priority Data

Jun. 8, 2018 (JP) ................................ 2018-110333

(51) Int. Cl.
*H02J 7/00* (2006.01)
*G01R 31/367* (2019.01)
(Continued)

(52) U.S. Cl.
CPC .......... *H02J 7/0048* (2020.01); *G01R 31/367* (2019.01); *G01R 31/392* (2019.01);
(Continued)

(58) Field of Classification Search
CPC ........ H02J 7/0048; H02J 7/005; H02J 7/0068; G01R 31/392; G01R 31/367; G06N 20/00; G06N 5/04; H01M 10/48
(Continued)

(56) References Cited

U.S. PATENT DOCUMENTS

| | | | | |
|---|---|---|---|---|
| 8,855,954 B1 * | 10/2014 | Bickford | .............. | G01R 31/392 702/63 |
| 10,074,882 B2 * | 9/2018 | Nakaya | ................... | B60L 58/10 |

(Continued)

FOREIGN PATENT DOCUMENTS

| | | | | |
|---|---|---|---|---|
| CN | 107015158 A | * | 8/2017 | .......... G01R 31/367 |
| CN | 107870306 A | * | 4/2018 | |

(Continued)

OTHER PUBLICATIONS

International Search Report for parent Application No. PCT/JP2019/022945, mailed Aug. 27, 2019.
(Continued)

*Primary Examiner* — Suresh Memula
(74) *Attorney, Agent, or Firm* — Renner, Otto, Boisselle & Sklar, LLP

(57) ABSTRACT

A battery management system includes an electronic device including a battery and a management server connected to the electronic device via a network. The electronic device transmits battery information, including information indicating the battery status, to the management server. The management server accumulates the battery information received from the electronic device in a storage. The management server predicts the current status of the battery of the electronic device based on the battery information of the electronic device, and transmits control information for the battery control of the electronic device to the electronic device based on a prediction result.

14 Claims, 10 Drawing Sheets

(51) Int. Cl.
    *G01R 31/392*    (2019.01)
    *G06N 5/04*      (2023.01)
    *G06N 20/00*     (2019.01)
    *H01M 10/48*     (2006.01)

(52) U.S. Cl.
    CPC .............. *G06N 5/04* (2013.01); *G06N 20/00* (2019.01); *H01M 10/48* (2013.01); *H02J 7/005* (2020.01); *H02J 7/0068* (2013.01)

(58) Field of Classification Search
    USPC ........................................................ 320/134
    See application file for complete search history.

(56) References Cited

U.S. PATENT DOCUMENTS

| | | | |
|---|---|---|---|
| 10,556,510 B2* | 2/2020 | Yazami | H01M 10/486 |
| 11,691,518 B2* | 7/2023 | Holme | G01R 31/382 |
| | | | 701/22 |
| 2001/0035732 A1 | 11/2001 | Sakakibara | |
| 2006/0181245 A1* | 8/2006 | Mizuno | G01R 31/367 |
| | | | 320/132 |
| 2012/0249057 A1* | 10/2012 | Abe | H02J 7/0071 |
| | | | 320/137 |
| 2013/0253715 A1* | 9/2013 | Cho | B60L 58/10 |
| | | | 700/286 |
| 2014/0088897 A1* | 3/2014 | Sharma | G06F 30/23 |
| | | | 702/63 |
| 2016/0209473 A1* | 7/2016 | You | G01R 31/367 |
| 2016/0259014 A1* | 9/2016 | Adagouda Patil | G01R 31/392 |
| 2016/0261131 A1* | 9/2016 | Childress | H02J 7/0069 |
| 2016/0363632 A1 | 12/2016 | Park | |
| 2017/0054317 A1* | 2/2017 | Katsuki | G01R 31/392 |
| 2017/0250536 A1* | 8/2017 | Takatsuka | G01R 19/2513 |
| 2018/0026454 A1* | 1/2018 | Belkacem-Boussaid | G06N 3/08 |
| | | | 702/63 |
| 2018/0095140 A1* | 4/2018 | Park | G01R 31/367 |
| 2018/0143257 A1* | 5/2018 | Garcia | G01R 31/382 |
| 2018/0316204 A1* | 11/2018 | Basu | H02J 7/005 |
| 2019/0064123 A1* | 2/2019 | Steingart | G01N 29/043 |
| 2019/0176639 A1* | 6/2019 | Kumar | B60L 3/0046 |
| 2019/0202414 A1* | 7/2019 | Shih | B60L 53/665 |
| 2019/0202415 A1* | 7/2019 | Lai | B60L 53/80 |
| 2019/0312317 A1* | 10/2019 | Ballantine | H01M 10/48 |
| 2020/0164763 A1* | 5/2020 | Holme | B60L 58/21 |
| 2022/0179009 A1* | 6/2022 | Simonis | G06N 20/00 |

FOREIGN PATENT DOCUMENTS

| | | | | |
|---|---|---|---|---|
| CN | 113901707 A | * | 1/2022 | |
| EP | 1691209 A1 | * | 8/2006 | ............. F25D 16/00 |
| EP | 2975421 A1 | * | 1/2016 | ............. B60L 58/10 |
| JP | 2004-246811 A | | 9/2004 | |
| JP | 2005-348598 A | | 12/2005 | |
| JP | 2010-067000 A | | 3/2010 | |
| JP | 2011-109910 A | | 6/2011 | |
| JP | 2015-181326 A | | 10/2015 | |
| JP | 2017-004955 A | | 1/2017 | |
| KR | 102527334 B1 | * | 5/2023 | |
| WO | WO-2010026930 A1 | * | 3/2010 | ......... G01R 31/3651 |
| WO | WO-2015076002 A1 | * | 5/2015 | ......... G01R 31/3679 |
| WO | WO-2015198631 A1 | * | 12/2015 | ........... G01R 31/367 |
| WO | WO-2017152180 A1 | * | 9/2017 | ............. G05B 15/02 |
| WO | WO-2018147194 A1 | * | 8/2018 | ............. G01R 31/36 |
| WO | WO-2022034983 A1 | * | 2/2022 | ........... G01R 31/385 |

OTHER PUBLICATIONS

Office Action for corresponding Japanese Application No. 2020-523219 dated May 24, 2022 and its English Translation.
English language translation of the International Preliminary Report on Patentability for corresponding Application No. PCT/JP2019/022945, mailed Dec. 17, 2020.
Office Action for corresponding Japanese Application No. 2020-523219 dated Nov. 24, 2021 and its English Translation.
Notice of Reasons for Refusal for corresponding Japanese Application No. 2022-132913 issued Oct. 31, 2023 and its English Machine Translation.

* cited by examiner

Fig.5

| INFORMATION THAT CAN BE READ FROM BATTERY | CHARGE AND DISCHARGE INFORMATION OF BATTERY | FIRMWARE VERSION OF BATTERY |
| | | DETERIORATION INFORMATION (DEGREE OF DETERIORATION) OF BATTERY |
| | | REMAINING CAPACITY OF BATTERY |
| | | CURRENT VOLTAGE (FOR EACH CELL) OF BATTERY CURRENT CURRENT OF BATTERY |
| | INFORMATION UNIQUE TO BATTERY | DATE OF MANUFACTURE OF BATTERY |
| | | SERIAL NUMBER OF BATTERY |
| | USAGE INFORMATION OF BATTERY | DATE OF START OF USE OF BATTERY |
| | | TEMPERATURE OF BATTERY, AMBIENT TEMPERATURE |
| | | CURRENT STATUS (CAPACITY) OF BATTERY |

Fig. 8

| | STAGE 0 | STAGE 1 | STAGE 2 |
|---|---|---|---|
| DEGREE OF DETERIORATION (%) | 70~100 | 50~70 | 0~50 |
| CELL VOLTAGE DIFFERENCE (mV) | 100 | 100~300 | 300~500 |

Fig.10

| WARNING LEVEL | STAGE | WARNING MESSAGE |
|---|---|---|
| 1 | STAGE 1 | BATTERY IS DETERIORATED. PLEASE CONSIDER REPLACING BATTERY. |
| 2 | STAGE 2 | BATTERY IS DETERIORATED. PLEASE CONSIDER REPLACING BATTERY. |
| 3 | STOP | BATTERY HAS REACHED ITS LIFE. BATTERY FUNCTION IS STOPPED. PLEASE REPLACE BATTERY. |

BATTERY MANAGEMENT SYSTEM AND BATTERY MANAGEMENT METHOD

CROSS REFERENCE TO RELATED APPLICATIONS

The present application is a continuation of PCT/JP2019/022945 filed Jun. 10, 2019, which claims priority to Japanese Patent Application No. 2018-110333, filed Jun. 8, 2018, the entire contents of each of which are incorporated herein by reference.

BACKGROUND

1. Technical Field

The present disclosure relates to a battery management system that manages the battery status of a remote electronic device.

2. Related Art

JP 2015-181326 A discloses a power management system that remotely controls charging/discharging of a storage battery. In the power management system, a load device connected to a power system, a storage battery connected to the power system, and a storage battery-mounted device equipped with a charge/discharge control device that controls charge/discharge of the storage battery according to a predetermined charge/discharge algorithm are connected to an EMS controller via a network (LAN line). The EMS controller transmits the charge/discharge algorithm of the storage battery-mounted device to the charge/discharge control device via the network, and the charge/discharge control device holds the transmitted charge/discharge algorithm and performs the charge/discharge operation of the storage battery according to the transmitted charge/discharge algorithm.

SUMMARY

The present disclosure provides a battery management system that remotely monitors the battery status of an electronic device and appropriately controls the electronic device according to the battery status.

In a first aspect of the present disclosure, a battery management system includes an electronic device including a battery and a management server connected to the electronic device via a network. The electronic device transmits battery information, including information indicating the battery status, to the management server. The management server accumulates the battery information received from the electronic device in a recording medium. The management server predicts the current status of the battery of the electronic device based on the battery information of the electronic device stored in the storage, and transmits control information for the battery control of the electronic device to the electronic device based on the predicted current status.

In a second aspect of the present disclosure, a management server connected to an electronic device including a battery via a network is provided. The management server includes a storage that accumulates battery information received from the electronic device, the battery information including information indicating a status of the battery, and a control circuit. The control circuit predicts a current status of a battery of the electronic device based on the battery information of the electronic device accumulated in the storage, and generates control information for battery control of the electronic device based on the predicted current status, and transmits the control information to the electronic device.

In a third aspect of the present disclosure, a battery management method in a management system including an electronic device including a battery and a management server connected to the electronic device via a network is provided. The electronic device transmits battery information including information indicating the battery status to the electronic device. The management server accumulates the battery information received from the electronic device in a recording medium. The management server predicts the current status of the battery of the electronic device based on the battery information of the electronic device, and transmits control information for the battery control of the electronic device to the electronic device based on the predicted current status. The electronic device performs battery control of the electronic device according to the control information received from the management server.

According to the present disclosure, a battery management system that remotely monitors the battery status of an electronic device and appropriately controls the electronic device according to the battery status can be provided.

BRIEF DESCRIPTION OF DRAWINGS

FIG. 5 is a diagram showing an example of battery information;

FIG. 8 is a diagram explaining correspondence between a stage and the degree of deterioration and a cell voltage difference of the battery;

FIG. 10 is a diagram explaining correspondence between a stage and a warning message.

DETAILED DESCRIPTION OF EMBODIMENTS

Hereinafter, embodiments of the present disclosure will be described with reference to the drawings as appropriate. However, in the detailed description, an unnecessary part of the description relating to the prior art and substantially the sane configuration may be omitted. This is for the sake of simplicity of the description. Further, the description below and accompanying drawings are disclosed so that those skilled in the art can fully understand the present disclosure, and are not intended to limit the subject matter of claims.

First Embodiment

1. Configuration

The battery management system according to an embodiment of the present disclosure is a system that remotely monitors the status of a battery incorporated in each information device, and transmits, to each information device, a control parameter for controlling a battery in the device according to the monitored battery status.

Figure 1:
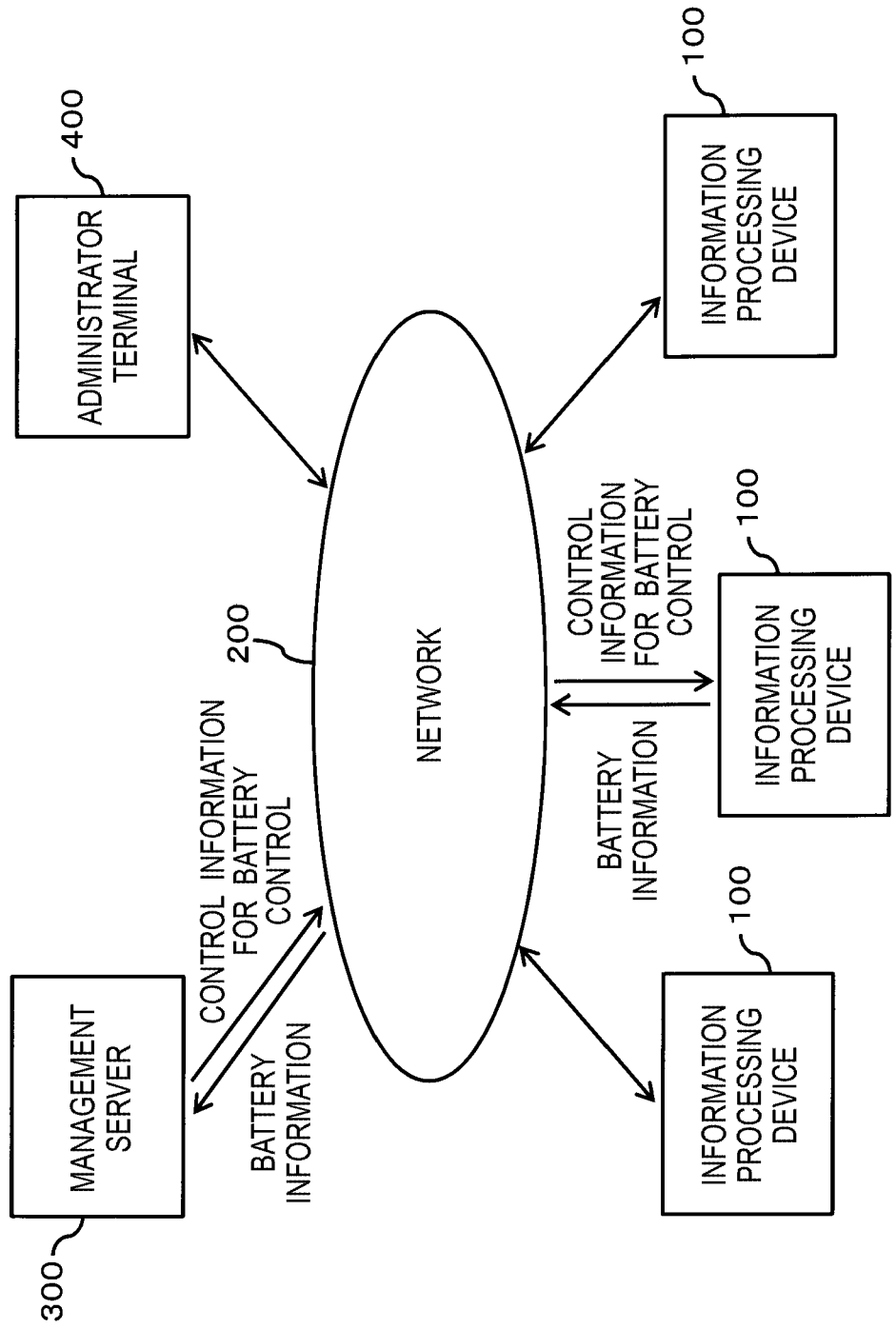
FIG. 1 is a diagram showing a configuration of a battery management system according to an embodiment of the present disclosure.

FIG. 1 is a diagram showing a configuration of the battery management system according to an embodiment of the present disclosure. The battery management system 1 includes an information processing device 100 and a management server 300. The information processing device 100 and the management server 300 are connected to each other via a network 200, and can perform data communication with each other.

The information processing device 100 incorporates a battery that supplies power to its own device. The management server 300 is a server that manages a battery of a plurality of the information processing devices 100. The management server 300 acquires battery information including information relating a battery, which is information indicating the battery status, from the information processing device 100 via the network 200. The management server 300 accumulates the acquired battery information. The management server 300 predicts the battery status of the information processing device 100 based on the accumulated battery information of the information processing device 100, and based on the prediction result, transmits control information regarding the battery control of the information processing device 100 to the information processing device 100. The control information includes, for example, a parameter indicating the battery status or a command for controlling the function of the battery.

The management server 300 is also connected to an administrator terminal 400 via the network 200. The administrator can make an access to information managed by the management server 300 via the administrator terminal 400 and perform browsing and the like.

1.1 Information Processing Device

Figure 2:
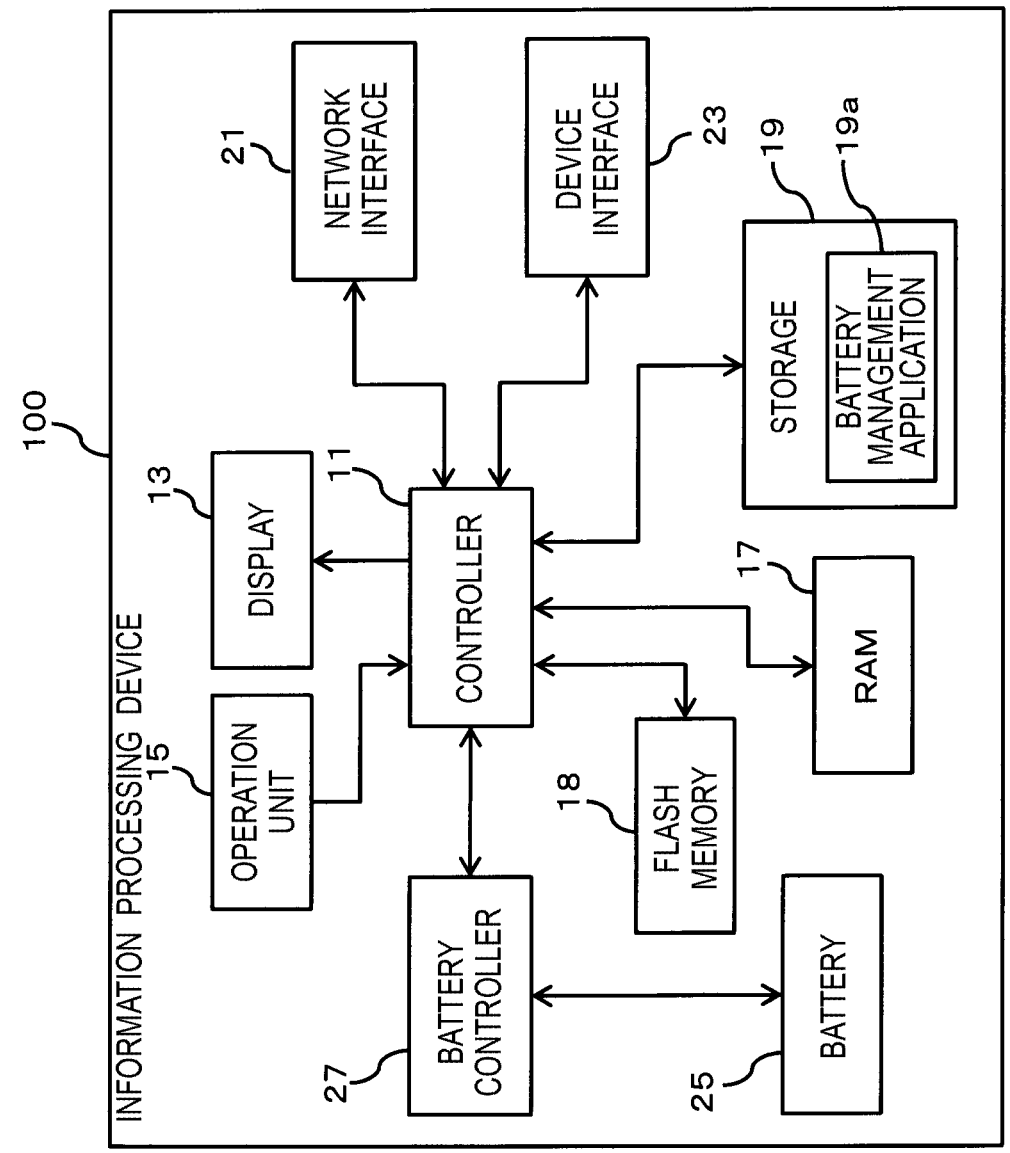
FIG. 2 is a block diagram showing a configuration of an information processing device.

The information processing device 100 is an information device such as a personal computer, a tablet terminal, or a smartphone. FIG. 2 is a block diagram showing a configuration of the information processing device 100. As shown in FIG. 2, the information processing device 100 includes a controller 11, a display 13, an operation unit 15, a RAM 17, a flash memory 18, a storage 19, a network interface (I/F) 21, a device interlace (I/F) 23, a battery 25, and a battery controller 27.

The controller 11 is a controller that controls the entire information processing device 100. The controller 11 includes a general-purpose processor such as a CPU or MPU that realizes a predetermined function by executing a program. The controller 11 realizes various types of control in the information processing device 100 by calling and executing a control program stored in the storage 19, The controller 11 is not limited to one that realizes a predetermined function by the cooperation of hardware and software, and may be a hardware circuit specially designed to realize a predetermined function. That is, the controller 11 can be realized by various processors such as a CPU, MPU, GPU, FPGA, DSP, and ASIC.

The RAM 17 is a memory that functions as a work area of the controller 11, and is a DRAM, SRAM, or the like. The flash memory 18 is a non-volatile memory that records information acquired from the battery 25.

The display 13 is a display device that displays various types of information such as an image and text. The display 13 is a liquid crystal display, an organic EL display, and the like.

The operation unit 15 is an input interface that receives an input instruction from the user. The operation unit 15 converts the input instruction and the content of operation received from the user into an electric signal and transmits the signal to the controller 11. The operation unit 15 includes a mouse, a keyboard, a touch panel, a touch pad, a switch, a button, and the like.

The storage 19 is a recording medium for recording various types of information. The storage 19 is realized by, for example, a flash memory, a solid state device (SSD), a hard disk, another storage device, or a combination of these as appropriate. The storage 19 stores a control program executed by the controller 11, various types of information detected for determining the battery status, and the like. The storage 19 stores a battery management application 19a.

The network I/F 21 is an interface circuit (module) for enabling communication with the management server 300 via the network 200. The network I/F 21 performs communication according to a standard such as Wi-Fi, IEEE802.2, IEEE802.3, 3G, LTE, or the like.

The network 200 is, in addition to the Internet, an intranet, an extranet, a LAN, an ISDN, a VAN, a CATV communication network, a virtual dedicated network, a telephone line network, a mobile communication network, a satellite communication network, or the like.

The device I/F 23 is an interface circuit (module) that connects the information processing device 100 and a peripheral device (for example, a printer). As the device I/F 23, various interfaces such as a universal serial bus (USB), a high definition multimedia interface (HDMI, registered trademark), IEEE1394, and Bluetooth (registered trademark) are used.

The battery 25 is a power source that supplies drive voltage to the information processing device 100. The battery 25 is a rechargeable secondary battery such as a lithium ion battery, a nickel cadmium battery, or a nickel hydrogen battery. The battery 25 includes a plurality of cells. When the battery 25 is in a healthy state, voltages are equal between the cells. However, as the use of the battery 25 progresses, a difference occurs in voltages between the cells, and the performance of the battery deteriorates according to the magnitude of the difference. Hereinafter, the voltage difference between the cells will be referred to as "cell voltage difference".

The battery controller 27 is a circuit that controls the battery 25 of the information processing device 100. The battery controller 27 controls, for example, the charging/discharging of the battery 25 and the operation of the information processing device 100 when the power is turned off. The battery controller 27, which can be composed of a programmable microcomputer, may be composed of a CPU or the like, like the controller 11.

The battery controller 27 can acquire battery information (described later) from the battery 25. The controller 11 acquires the battery information of the battery 25 via the battery controller 27. The acquired information is stored in the flash memory 18.

1.2 Management Server

Figure 3:
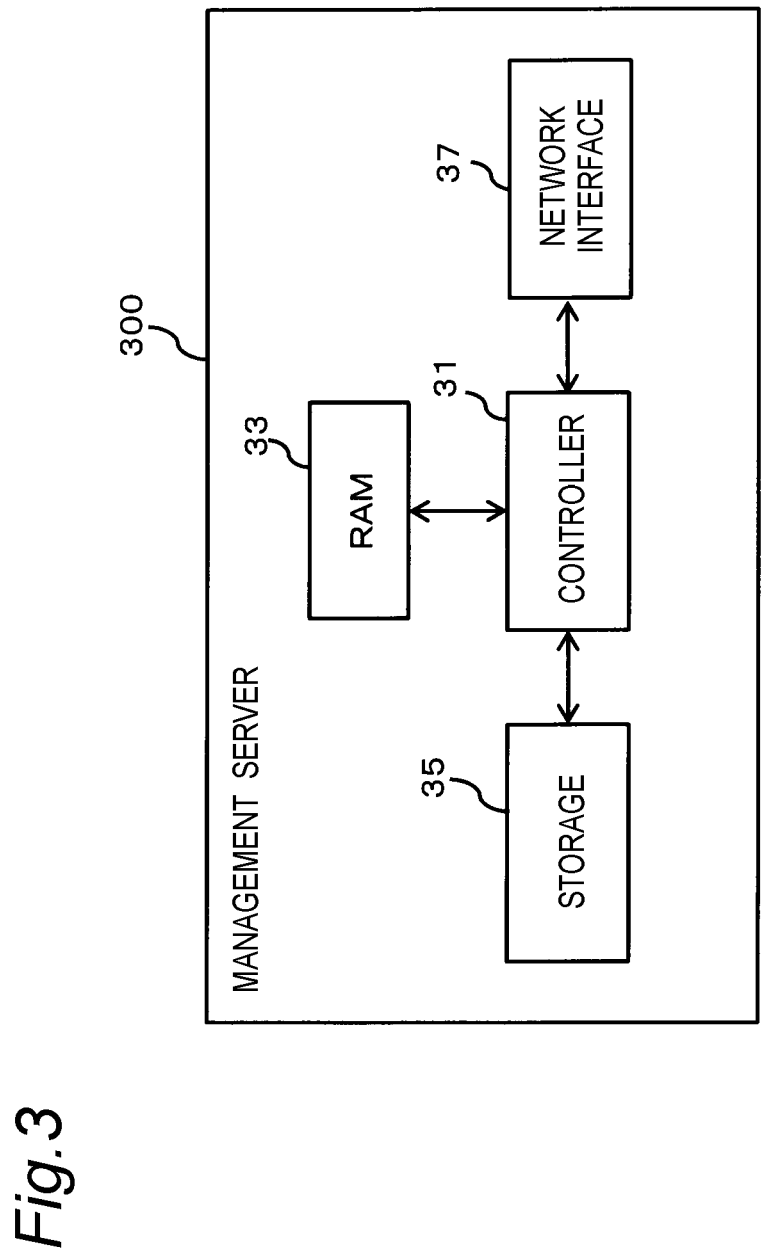
FIG. 3 is a block diagram showing a configuration of a management server.

FIG. 3 is a block diagram showing a configuration of the management server 300. As shown in FIG. 3, the management server 300 includes a controller 31, a RAM 33, a storage 35, and a network interface (I/F) 37.

The controller 31 is a controller that controls the entire management server 300. The controller 31 includes a general-purpose processor such as a CPU or MPU that realizes a predetermined function by executing a program. The controller 31 realizes various types of control in the management server 300 by calling and executing a control program stored in the storage 35. The controller 31 is not limited to one that realizes a predetermined function by the cooperation of hardware and software, and may be a hardware circuit specially designed to realize a predetermined function. That is, the controller 31 can be realized by various processors such as a CPU, MPU, GPU, FPGA, DSP, and ASIC. The storage 35 is a recording medium for recording various types of information. The storage 35 is realized by, for example, a flash memory, a solid state device (SSD), a hard disk, another storage device, or a combination of these as appropriate.

The RAM 33 functions as a work area of the controller 31. The network I/F 37 is an interface circuit (module) for enabling communication with the information processing device 100 via the network 200. The network I/F 37 performs communication according to a standard such as Wi-Fi, IEEE802.2, IEEE802.3, 3G, LTE, or the like.

Figure 4:
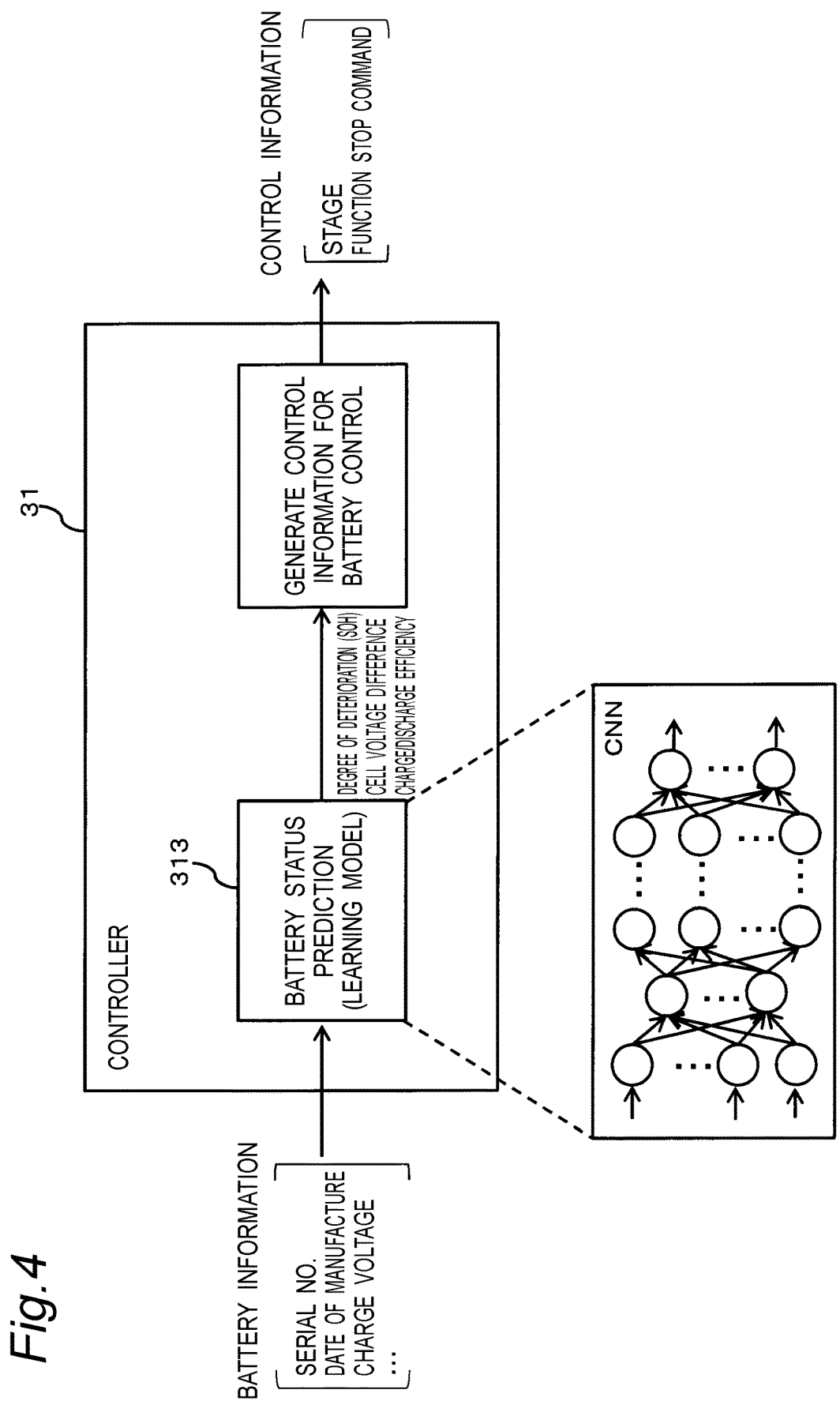
FIG. 4 is a diagram showing a functional configuration of a controller of the management server.

FIG. 4 is a diagram explaining a function of the controller 31 of the management server 300. The controller 31 has a function of predicting the battery status based on the battery information and a function of generating control information for controlling the battery control in the information processing device 100 based on the prediction result.

The function of predicting the battery status of the controller 31 is realized by a learning model 313 that is machine-learned to receive input of battery information including information on predetermined items related to each battery, and output the degree of deterioration (states of health, SOH), the cell voltage difference, and charge/discharge efficiency of the battery. The learning model includes, for example, a convolutional neural network (CNN). The convolutional neural network includes an input layer, an intermediate layer, and an output layer, and each layer has a plurality of nodes. A weighting coefficient of each node is determined by learning as shown below. The learning model is not limited to a convolutional neural network, and may be other neural networks (for example, a recurrent neural network).

FIG. 5 is a diagram showing an example of the battery information used for machine learning for the learning model of the management server 300, The battery information includes information that is unique to the battery and does not change over time, and information that changes over time. The information that changes over time includes one that changes from moment to moment and one that changes in a stepwise manner. In the example of FIG. 5, the battery information includes the firmware version of the battery and the deterioration information (degree of deterioration) of the battery. The battery information also includes the remaining capacity of the battery, the current voltage of the battery (voltage of each cell), and the current of the battery. Further, the battery information also includes the date of manufacture of the battery and a serial number. Furthermore, the battery information includes the start date of use of the battery, a battery temperature, an ambient temperature, and the current state (capacity) of the battery.

The data shown in FIG. 5 is collected from a large number of the information processing devices 100 mounted with a battery, and the learning model 313 is trained using the data. Specifically, the time series of information on the battery as shown in FIG. 5 collected from each information processing device is input to the learning model 313. Then, the learning model is trained to output the tendency of changes over time in the degree of deterioration, the cell voltage difference, and the charge/discharge efficiency (=capacity that can be discharged/charge capacity) of the battery.

Figure 6:
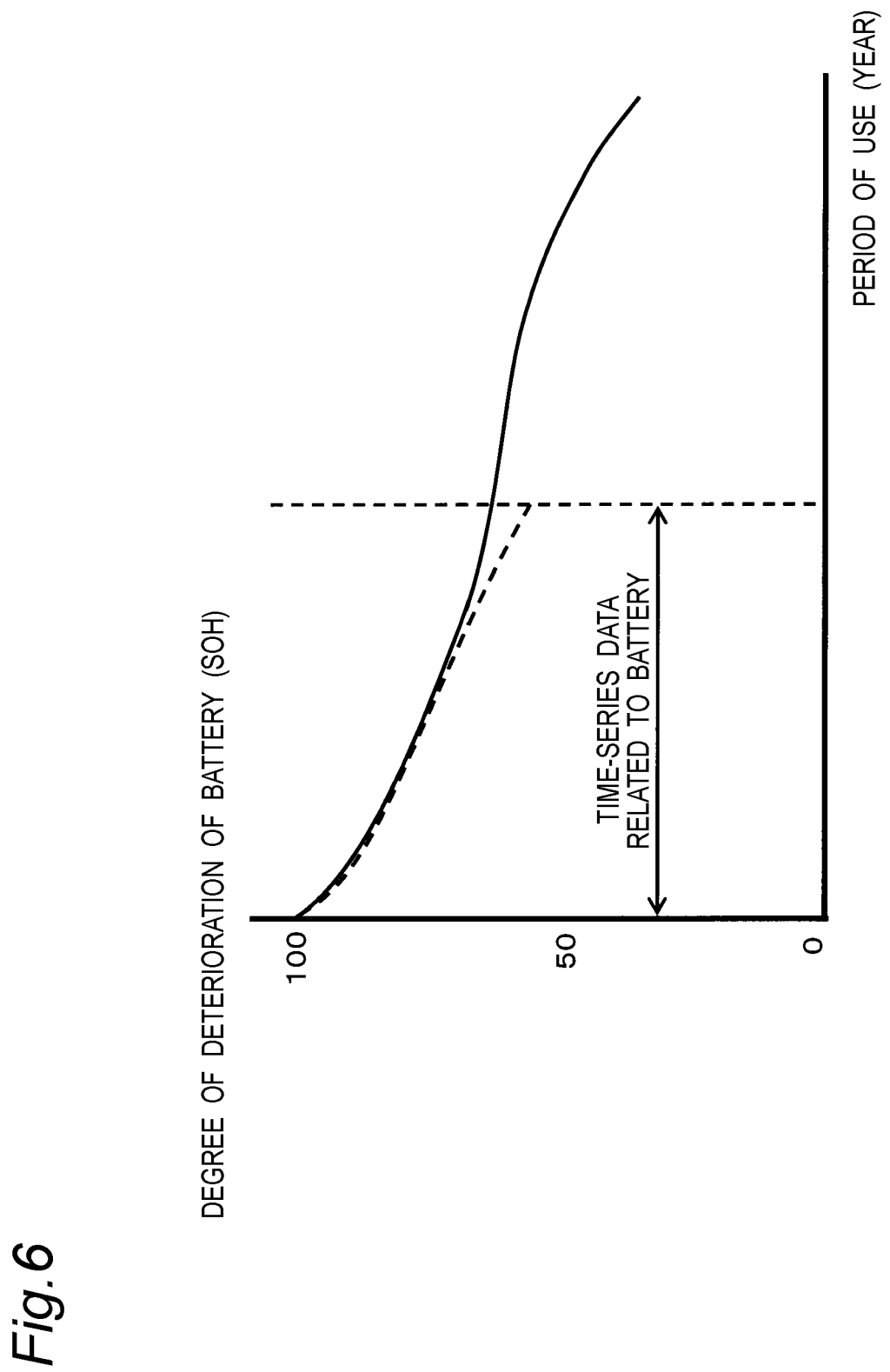
FIG. 6 is a diagram explaining an example of a change over time in degree of deterioration (SOH) of a battery.

FIG. 6 is a diagram showing an example of a change over time in the degree of deterioration (SOH) of the battery. The longer the usage time, the lower the value of the degree of deterioration (SOH) of the battery (the more the deterioration progresses). The learning model 313 receives input of time-series data (information indicating a change over time) of the battery information, and, based on the input, predicts a change over time in the degree of deterioration of the battery as shown by the broken line in FIG. 6.

2. Operation

Operation of the battery management system 1 configured as described above will be described.

The information processing device 100 collects the battery information on the battery 25 that is incorporated, and transmits the battery information to the management server 300 via the network 200. This function of the information processing device 100 is performed by the battery management application 19a. The battery information includes information unique to the battery, such as a serial number, the date of manufacture, and the date of start of use, and information that changes temporally, such as voltage of the battery, current, remaining capacity, and capacity, as shown in FIG. 5. Pieces of the information that change temporally do not need to be measured all at the same timing, and may be measured at timings different between the pieces of the information. Further, as to the battery information, a plurality of pieces of the information shown in FIG. 5 do not always need to be transmitted at the same time, and may be transmitted to the management server 300 at timings different between each type of information. For example, the information unique to the battery that does not change, such as a serial number does not need to be transmitted every time, and may be transmitted to the management server 300 at least once.

The information that changes temporally such as voltage of the battery is collected at predetermined intervals or at any time. The information processing device 100 transmits the information collected at a predetermined timing to the management server 300 as battery information. While the information processing device 100 is turned on, the battery management application 19a (controller 11) collects information on the battery 25. While the information processing device 100 is turned off, the battery controller 27 collects information on the battery 25, and the collected information is stored in the flash memory 18. Then, when the information processing device 100 is turned on, the battery management application 19a reads the information from the flash memory 18 and transmits the information to the management server 300. In this way, even in a case where the information processing device 100 is turned off, the information on the battery 25 is collected and transmitted to the management server 300 when the power is turned on.

The management server 300 receives the battery information from a plurality of the information processing devices 100 and stores the battery information in the storage 19. At this time, the management server 300 manages the battery information separately for each of the information processing devices 100, Since the battery information is transmitted from the information processing device 100 to the management server 300 periodically or at any time, the battery information is accumulated in the management server 300 in time series for each information processing device. The time-series data of the accumulated battery information may be used for updating the learning model 313 implemented in the controller 31 at an appropriate timing.

The management server 300 analyzes the battery status of the information processing device 100 based on the information accumulated in the storage 35 at a predetermined timing or when a request is received from the information processing device 100. Further, the management server 300 sets a parameter related to battery control in the information processing device 100 as necessary based on the analysis result. The management server 300 transmits the analysis result and the parameter to the information processing device.

Figure 7:
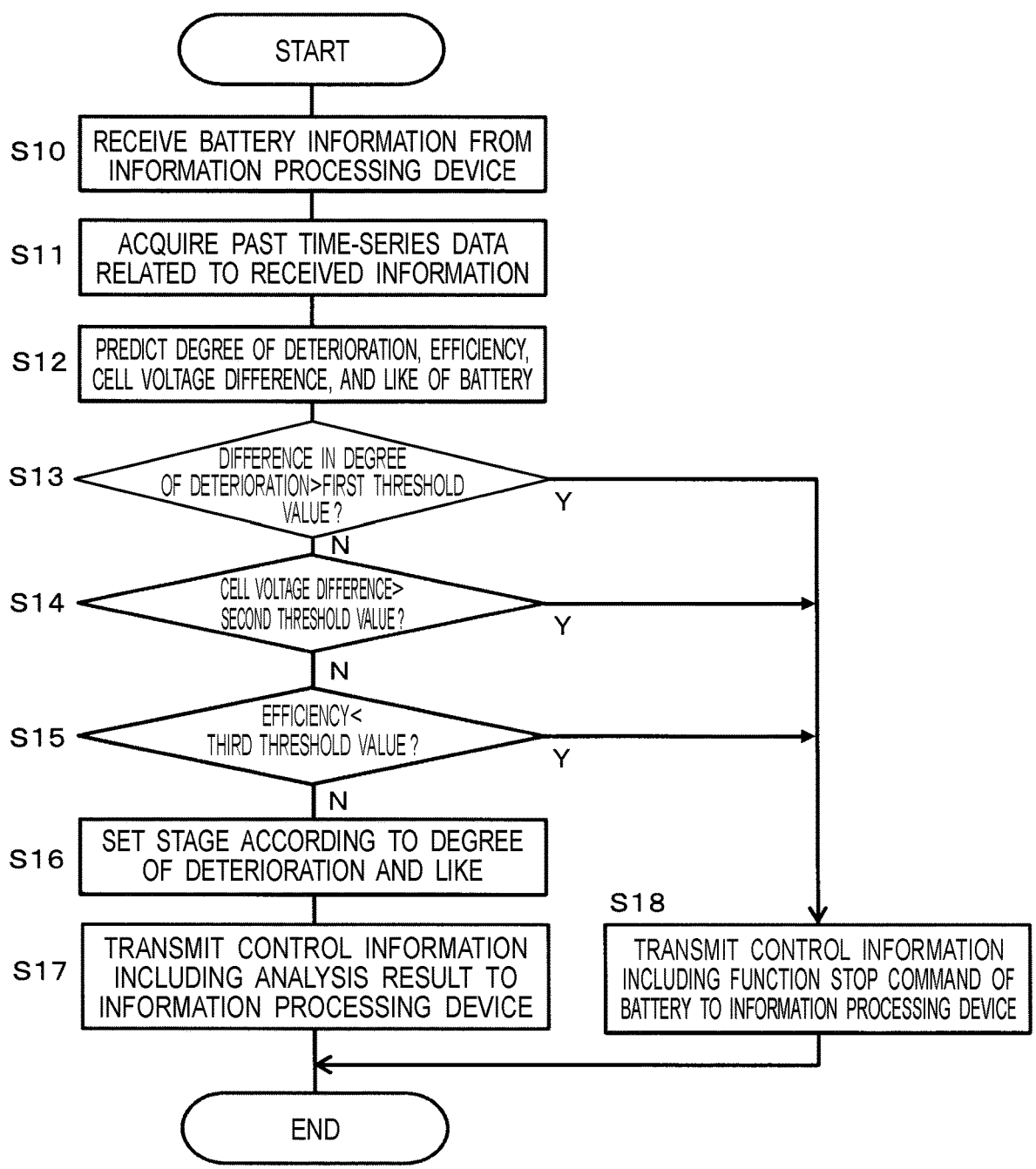
FIG. 7 is a flow chart showing processing of the management server.

FIG. 7 is a flowchart showing analysis processing of the battery status and parameter setting processing for a specific information processing device by the management server 300. Hereinafter, the processing of the flowchart of FIG. 7 will be described.

The management server 300 receives the battery information from the information processing device 100 via the network 200 (S10). This battery information includes information as shown in FIG. 5 regarding the battery 25 of the information processing device 100, and includes at least information on the degree of deterioration of the battery, or information substantially equivalent to the degree of deterioration.

The management server 300 reads the time series data of the past battery information on the battery 25 related to the received battery information from the storage 35 (S11). That is, based on the serial number of the battery included in the battery information, the management server 300 reads the past battery information for the same battery from the storage 35 as time series data.

The management server 300 synthesizes the battery information received this time and the read past t e series data and inputs them into the learning model 313, and acquires a prediction value of each of the degree of deterioration, the efficiency, and the cell voltage difference of the battery from the learning model 313 (S12).

Next, the controller 31 determines the battery status and the necessity of stopping the battery function based on the degree of deterioration, the efficiency, and the cell voltage difference of the battery (S13 to S15), and transmits control information based on the determination result to the information processing device 100 (S16 to S18).

Specifically, the controller 31 obtains a difference between the predicted degree of deterioration and the latest degree of deterioration actually measured of the battery 25 of the target information processing device 100, and compares the difference in the degree of deterioration with a first threshold value (S13). In a case where the difference in the degree of deterioration is larger than the first threshold value (YES in S13), the controller 31 transmits a function stop command for stopping the function of the battery of the information processing device 100 to the information processing device 100 as control information (S18). In a case where the difference in the degree of deterioration is larger than the first threshold value, that is, in a case where the latest degree of deterioration actually measured is significantly lower than the predicted degree of deterioration, it is considered that the deterioration of the battery is progressing rapidly. In such a case, it is determined that the battery is not in a normal state, and the function of the battery is stopped.

Further, the controller 31 determines whether or not the predicted cell voltage difference is larger than a second threshold value (S14). In a case where the predicted cell voltage difference is larger than the second threshold value (YES in S14), the controller 31 transmits a function stop command as control information to the information processing device 100 (S18). In a case where the cell voltage difference is large, there is a possibility of ignition. Therefore, in a case where the cell voltage difference is larger than the second threshold value, the function of the battery 25 is stopped.

Further, the controller 31 determines whether or not the predicted efficiency is smaller than a third threshold value (S15). In a case where the predicted efficiency is smaller than the third threshold value (YES in S15), the controller 31 transmits a function stop command as control information to the information processing device 100 (S18). In a case where the efficiency is smaller than the third threshold value, it is considered that the deterioration of the battery 25 has progressed considerably, so that the function of the battery 25 is stopped.

In a case where there is no problem in any of the degree of deterioration, the cell voltage difference, and the efficiency (NO in any of S13, S14, and S15), the controller 31 sets a stage of the battery 25 according to the degree of deterioration (S16). Here, the stage of the battery 25 will be described.

The stage is a classification for managing a deterioration status of the battery 25 in a stepwise manner. "Stage 0" indicates an excellent battery status. "Stage 1" indicates a slightly deteriorated status of the battery 25. "Stage 2" indicates the battery status that is further deteriorated than that of "Stage 1". FIG. 8 is a diagram explaining correspondence between the stage of the battery 25 and the degree of deterioration and the cell voltage difference of the battery 25. As the stage progresses from 0 to 2, the degree of deterioration deteriorates (the smaller the value, the more the deterioration progresses). Further, as the stage progresses from 0 to 2, the cell voltage difference increases. The information processing device 100 has a function of changing the control for the battery 25 according to the stage of the battery 25. For example, the information processing device 100 changes the charge voltage of the battery 25 according to the stage. The full charge voltage is controlled to 4.2 V at Stage 0, the full charge voltage is controlled to 4.1 V at Stage 1, and the full charge voltage is controlled to 3.8 V at Stage 2.

Returning to FIG. 7, the controller 31 transmits information indicating the set stage to the information processing device 100 as the control information (control parameters) (S17). When receiving the control information (control parameter) indicating the stage from the management server 300, the information processing device 100 updates the information on the stage managed by the own device based on the received control information.

As described above, the management server 300 analyzes the battery status of the target information processing device 100, and transmits the control information on battery control to the information processing device 100 based on the analysis result. The information processing device 100 appropriately changes the settings of the own device according to the control information received from the management server 300.

Figure 9:
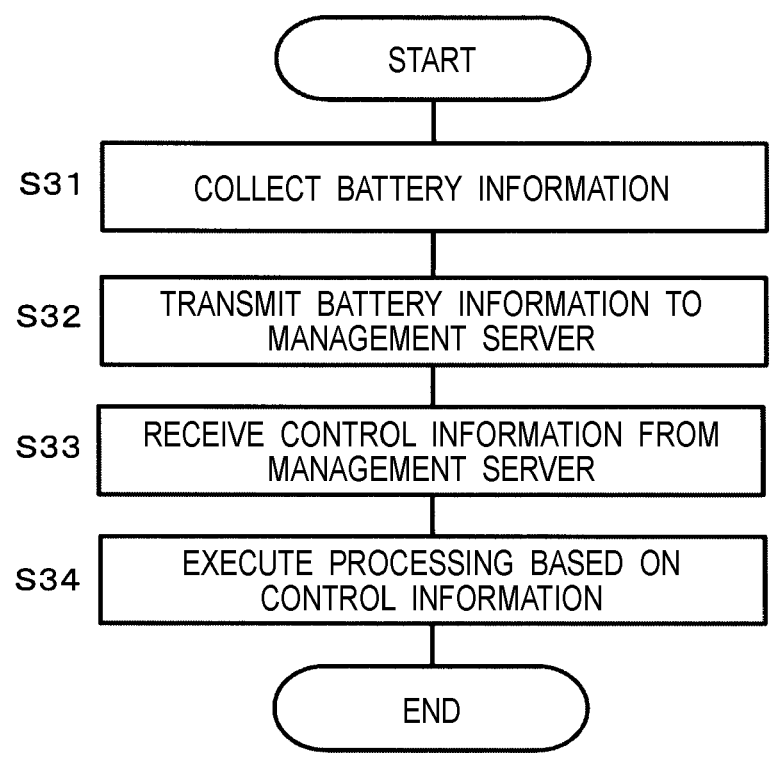
FIG. 9 is a flowchart showing processing of the information processing device.

FIG. 9 is a flowchart showing the processing of the information processing device 100. The information processing device 100 periodically collects predetermined information (information shown in FIG. 5) from the battery 25 (S31), For example, the information processing device 100 collects the voltage, current, remaining amount, capacity, and the like of the battery 25 every one hour.

When the collection of the information is finished, the information processing device 100 transmits the battery information based on the collected information to the management server 300 (32). The management server 300 analyzes the status of the battery 25 of the information processing device 100 based on the battery information received from the information processing device 100 as described above, and transmits the control information on battery control based on the analysis result to the information processing device 100.

The information processing device 100 receives the control information on battery control from the management server 300 (S33). The control information includes information indicating the stage predicted by the management server 300, or a command instructing stopping of the battery function.

The information processing device 100 performs control and the like of the battery 25 based on the control information (S34). For example, in a case where the information indicating the current stage of the battery 25 managed by the own device is different from the stage included in the battery information received from the management server 300, the information processing device 100 updates the information indicating the stage to be managed based on the stage included in the received battery information.

Note that a warning message may be displayed when the stage is changed. FIG. 10 is a diagram illustrating the correspondence between the stage of the battery 25 and the warning message. When a change is made from Stage 0 to Stage 1 or from Stage 1 to Stage 2, a message of warning level 1 or 2, that is, the message "Battery is depleted. Consider replacing the battery" may be displayed.

Alternatively, when the function stop command is received from the management server 300, the information processing device 100 performs control to stop the function of the battery 25. In this case, the warning message of warning level 3 shown in FIG. 10 is displayed and the battery function is stopped.

As described above, in the battery management system 1, the management server 300 implements a learning model in which the degree of deterioration of the battery is learned based on the battery information collected from various devices. The management server 300 acquires the battery information from the information processing device 100, determines the deterioration status of the battery 25 of the information processing device 100 by a learning model based on the battery information, and, according to the determination result, transmits a control parameter related to battery control to the information processing device 100, In response to this control parameter, the information processing device 100 updates the control parameter related to the battery control managed by the own device, and controls the function of the battery control. According to the battery management system 1, the degree of deterioration of the battery can be accurately determined, and the information processing device 100 can be operated so as to perform appropriate control of the battery according to the degree of deterioration of the battery.

3. Effect, and the Like

As described above, the battery management system 1 of the present embodiment includes the information processing device 100 provided with the battery 25, and the management server 300 connected to the information processing device 100 via the network 200. The information processing device 100 transmits the battery information including information indicating the status of the battery 25 to the management server 300. The management server 300 accumulates the battery information received from the information processing device 100 in the storage 35. The management server 300 predicts the current status of the battery 25 of the information processing device 100 based on the battery information of the information processing device 100, and based on the prediction result, transmits control information regarding the battery control of the information processing device 100 to the information processing device 100.

With the above configuration, the management server 300 can predict the battery status of the information processing device 100 based on the battery information received from the information processing device 100, and control the information processing device 100 to be in a preferable state according to the battery status.

The management server 300 implements the learning model 313 that is machine-learned based on the battery information collected from a plurality of the information processing devices 100. The learning model 313 receives input of the battery information and causes the management server 300 to function to output at least one of information indicating the degree of deterioration of the battery, information indicating the difference between voltages of the cells constituting the battery, and information indicating the charge/discharge efficiency of the battery.

The battery information includes at least one of information for identifying the battery, information indicating the physical status of the battery, and information indicating a usage status of the battery.

For example, the battery information includes at least one of a serial number of the battery, the date of manufacture of the battery, a firmware version, the date of start of use of the battery, the degree of deterioration of the battery, a voltage of the battery, a current of the battery, a temperature of the battery, an ambient temperature, and the capacity of the battery.

The control information includes, for example, classification information (for example, a stage) indicating the deterioration status of the battery of the information processing device 100 in a stepwise manner, or a command for stopping the function of the battery 25 of the information processing device 100.

The present embodiment also discloses the information processing device 100 including the battery 25 and the management server 300 connected via the network 200. The management server 300 includes the network interface 37 (an example of a receiving unit) that receives the battery information including information indicating the battery status from the information processing device 100, the storage 35 that accumulates the battery information received from the information processing device 100, the controller 31 that predicts the current status of the battery 25 of the information processing device 100 based on the battery information of the information processing device 100, and generates the control information for the battery control of the information processing device 100 based on the prediction result, and the network interface 37 (an example of a transmission unit) that transmits the control information to the information processing device 100.

The present embodiment also discloses the information processing device 100 which is an electronic device to which a drive power source is supplied from the battery 25.

The information processing device 100 includes the battery controller 27 (an example of an acquisition unit) that acquires the battery information including information on the battery status, the storage 19 that stores the acquired battery information, the controller 11 that controls the battery, and the network interface 21 (an example of a communication unit) that communicates with the management server 300 via the network 200. The controller 11 transmits the battery information to the management server 300 via the network interface 21. The controller 11 receives the control information related to control of the battery from the management server 300 via the network interface 21, and controls the battery according to the received control information.

The present embodiment also discloses a battery management method in the management system 1 including the information processing device 100 provided with the battery 25, the management server 300 connected to the information processing device 100 via the network 200. According to the battery management method, the information processing device 100 transmits the battery information including information indicating the battery status to the management server 300. The management server 300 accumulates the battery information received from the information processing device 100 in the storage 35. The management server 300 predicts the current status of the battery of the information processing device 100 based on the battery information of the information processing device 100, and based on the prediction result, transmits control information regarding the battery control of the information processing device 100 to the information processing device 100. The information processing device 100 performs battery control of the information processing device 100 according to the control information received from the management server.

Other Embodiments

The idea of the above embodiment is not limited to the embodiment described above. Various embodiments may be considered. Hereinafter, other embodiments to which the idea of the above embodiment can be applied will be described.

The battery information shown in the above embodiment (FIG. 5) is merely an example, and the content of the battery information is not limited to the information shown in FIG. 5. Various types of information on the battery can be included in the battery information. For example, the battery information may include information that identifies the battery, physical information on the battery, and information indicating the usage status of the battery.

In the above embodiment, as the control information related to battery control transmitted from the management server 300 to the information processing device 100, information indicating the stage of the battery and the command for stopping the function of the battery are exemplified. However, the control information is not limited to these. The control information related to the battery control may include various parameters or commands used for the battery control in the information processing device 100.

In the above embodiment, the management server 300 analyzes the battery status of the information processing device 100 in synchronization with the timing of receiving the battery information from the information processing device 100, and transmits the control information according to the battery status to the information processing device 100. However, the timing of analyzing the battery status and transmitting the control information is not limited to this.

The management server 300 may analyze the battery status of each information processing device and transmit the control information at an optional timing or a predetermined timing.

In the above embodiment, the controller of the management server 300 trains the learning model 313 so as to receive input of the battery information and output the degree of deterioration, the cell voltage difference, and the charge/discharge efficiency. However, the method of learning of the learning model 313 is not limited to this. The learning model 313 may be trained to receive input of the battery information and output other pieces of information regarding deterioration of the battery.

In the above embodiment, the information processing device is exemplified as the electronic device. However, the electronic device is not limited to this. The battery management control of the present disclosure can be applied to any electronic device as long as the device is driven by a battery as a power source, can collect the battery information, and can communicate with an external server.

As described above, the embodiment has been described as an example of the technique in the present disclosure. To that end, detailed description and accompanying drawings are disclosed. Therefore, the constituents described in the detailed description and the accompanying drawings may include a constituent that is not essential for solving the problem. Therefore, even if those non-essential constituents are described in the detailed description and accompanying drawings, those non-essential constituents should not be immediately recognized to be essential.

The above embodiment is for exemplifying the technique in the present disclosure. Therefore, in the above-described embodiment, various modifications, substitutions, additions, and/or omissions may be made within the scope of claims or the scope equivalent to the scope of claims.

The present disclosure may be applied to a system that manages the state of a battery for an electronic device driven by a power source from the battery.

What is claimed is:

1. A battery management system comprising:
   an electronic device including a battery; and
   a management server connected to the electronic device via a network, wherein
   the electronic device transmits battery information including at least two types of information indicating a status of the battery to the management server at different times depending on the type of the information, wherein each of the at least two types of information represent a different type of information and are transmitted at different times relative to one another based on the different type of information,
   the management server accumulates the battery information received from the electronic device in a storage, and
   the management server predicts a current status of a battery of the electronic device based on the battery information of the electronic device stored in the storage, and transmits control information for battery control of the electronic device to the electronic device based on the predicted current status.

2. The battery management system according to claim 1, wherein
   the management server implements a learning model that is machine-learned based on the battery information collected from a plurality of electronic devices, and
   the learning model receives input of the battery information and causes the management server to function to output at least one of information indicating degree of deterioration of the battery, information indicating a difference between voltages of cells constituting the battery, and information indicating charge/discharge efficiency of the battery.

3. The battery management system according to claim 1, wherein the battery information includes at least one of information for identifying a battery, information indicating a physical status of a battery, and information indicating a usage status of a battery.

4. The battery management system according to claim 3, wherein the battery information includes at least one of a serial number of a battery, date of manufacture of a battery, a firmware version, date of start of use of a battery, degree of deterioration of a battery, a voltage of a battery, a current of a battery, a temperature of a battery, an ambient temperature, and capacity of a battery.

5. The battery management system according to claim 1, wherein the control information includes classification information indicating a deterioration status of a battery of the electronic device in a stepwise manner.

6. The battery management system according to claim 1, wherein the control information includes a command for stopping a function of a battery of the electronic device.

7. A management server connected to an electronic device including a battery via a network, the management server comprising:
- an interface circuit that receives battery information including at least two types of information indicating a status of the battery from the electronic device at different times depending on the type of the information, wherein each of the at least two types of information represent a different type of information and are transmitted at different times relative to one another based on the different type of information;
- a storage that accumulates the battery information received from the electronic device;
- a control circuit that predicts a current status of a battery of the electronic device based on the battery information of the electronic device accumulated in the storage, and generates control information for battery control of the electronic device based on the predicted current status, and transmits the control information to the electronic device.

8. A battery management method in a management system including an electronic device including a battery, and a management server connected to the electronic device via a network, the battery management method comprising:
- transmitting battery information including at least two types of information indicating a status of the battery from the electronic device to the management server at different times depending on the type of the information, wherein each of the at least two types of information represent a different type of information and are transmitted at different times relative to one another based on the different type of information;
- accumulating the battery information received from the electronic device in a storage by the management server;
- predicting a current status of a battery of the electronic device based on the battery information accumulated in the storage, and transmitting control information for battery control of the electronic device to the electronic device based on the predicted current status by the management server; and
- performing battery control of the electronic device according to the control information received from the management server in the electronic device.

9. The battery management system according to claim 1, wherein the different times are a function of a predetermined tendency of a corresponding type of information to change with respect to time.

10. The battery management system according to claim 9, wherein a first type of information which changes less frequently with respect to time than a second type of information, is not transmitted each time the second type of information is transmitted.

11. The management server according to claim 7, wherein the different times are a function of a predetermined tendency of a corresponding type of information to change with respect to time.

12. The management server according to claim 11, wherein a first type of information which changes less frequently with respect to time than a second type of information, is not transmitted each time the second type of information is transmitted.

13. The battery management method according to claim 8, wherein the different times are a function of a predetermined tendency of a corresponding type of information to change with respect to time.

14. The battery management method according to claim 13, wherein a first type of information which changes less frequently with respect to time than a second type of information, is not transmitted each time the second type of information is transmitted.

* * * * *